US007475309B2

(12) United States Patent
Picano et al.

(10) Patent No.: US 7,475,309 B2
(45) Date of Patent: Jan. 6, 2009

(54) PARALLEL TEST MODE FOR MULTI-CORE PROCESSORS

(75) Inventors: Silvio Picano, Hillsboro, OR (US);
Sridhar Jayaraman, Portland, OR (US);
Peter DesRosier, Portland, OR (US);
James Chung, Milpitas, CA (US)

(73) Assignee: Intel Corporation, Santa Clara, CA (US)

( * ) Notice: Subject to any disclaimer, the term of this patent is extended or adjusted under 35 U.S.C. 154(b) by 586 days.

(21) Appl. No.: 11/174,198

(22) Filed: Jun. 30, 2005

(65) Prior Publication Data

US 2007/0022342 A1 Jan. 25, 2007

(51) Int. Cl.
*G01R 31/28* (2006.01)
(52) U.S. Cl. .................................. 714/727; 714/726
(58) Field of Classification Search ............... 714/727, 714/725, 726, 724, 733, 734, 30; 716/4
See application file for complete search history.

(56) References Cited

U.S. PATENT DOCUMENTS

| 5,056,094 | A * | 10/1991 | Whetsel ..................... 714/736 |
| 6,314,539 | B1 * | 11/2001 | Jacobson et al. ............ 714/727 |
| 6,405,335 | B1 * | 6/2002 | Whetsel ..................... 714/726 |
| 6,763,485 | B2 * | 7/2004 | Whetsel ..................... 714/726 |
| 7,120,843 | B2 * | 10/2006 | Whetsel ..................... 714/726 |
| 7,134,060 | B2 * | 11/2006 | Tanaka et al. ............... 714/724 |
| 7,139,947 | B2 * | 11/2006 | Miner et al. ................ 714/726 |
| 2003/0204805 | A1 | 10/2003 | Prabhu |
| 2004/0128596 | A1 | 7/2004 | Menon et al. |
| 2004/0267480 | A1 | 12/2004 | Day |

OTHER PUBLICATIONS

Swingler, Charles, "On-Chip Emulation for Functional Test and Diagnosis", EE Evaluation Engineering, http://www.evaluationengineering.com/archive/articles/0303board.htm, 2003.
Tripp, Mike, et al., "Elimination of Traditional Functional Testing of Iterface Timings at Intel", ITC International Test convergence, Paper 39.2, IEEE, 2003.

* cited by examiner

*Primary Examiner*—Phung M Chung
(74) *Attorney, Agent, or Firm*—Blakely, Sokoloff, Taylor & Zafman LLP

(57) ABSTRACT

An embodiment of the present invention is a technique to provide a parallel test mode for multi-core processors. A test access port (TAP) in a first processor core generates a first test data output (TDO) from a first test data input (TDI) or a first delayed TDI according to a TDO select bit. The first delayed TDI is clocked by a test clock (TCK). The first processor core has a first core circuit. The TAP generates a phase select word. A clock generator generates a clock signal synchronized with the TCK and has a low phase and a high phase. A first enable circuit enables first core data from the first core circuit in one of the low and high phases of the clock signal according to the phase select word.

20 Claims, 5 Drawing Sheets

PARALLEL TEST MODE FOR MULTI-CORE PROCESSORS

BACKGROUND

1. Field of the Invention

Embodiments of the invention relate to the field of semiconductor devices, and more specifically, to testing of semiconductor devices.

2. Description of Related Art

Testing of semiconductors devices during manufacturing process is generally classified into two techniques: sequential test and parallel test. Parallel test usually offers cost saving in terms of testing time and capital equipment purchases. Most test techniques generate test data input (TDI) to a test access port (TAP) and interfaces to an automatic test equipment (ATE) devices.

There are assembled products that may not be efficiently tested using parallel test mode. Examples of these products include joined-at-bump cores or processor cores that do not have co-operative or shared circuit designs. Existing techniques to provide parallel test mode for these assembled products have a number of disadvantages. One technique uses a software mechanism to achieve parallel TDI signal delivery. This technique requires increased number of TAP instructions, increased TAP test time, increased ATE vector memory consumption, and increased simulation and design collateral complexity. Other techniques are unable to detect mid-band signals from multiple processors or multiple cores, and therefore have limited use in parallel test mode.

BRIEF DESCRIPTION OF THE DRAWINGS

Embodiments of the invention may best be understood by referring to the following description and accompanying drawings that are used to illustrate embodiments of the invention. In the drawings.

DESCRIPTION

An embodiment of the present invention is a technique to provide a parallel test mode for multi-core processors. A test access port (TAP) in a first processor core generates a first test data output (TDO) from a first test data input (TDI) or a first delayed TDI according to a TDO select bit. The first delayed TDI is clocked by a test clock (TCK). The first processor core has a first core circuit. The TAP generates a phase select word. A clock generator generates a clock signal synchronized with the TCK and has a low phase and a high phase. A first enable circuit enables first core data from the first core circuit in one of the low and high phases of the clock signal according to the phase select word.

In the following description, numerous specific details are set forth. However, it is understood that embodiments of the invention may be practiced without these specific details. In other instances, well-known circuits, structures, and techniques have not been shown to avoid obscuring the understanding of this description.

One embodiment of the invention may be described as a process which is usually depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a program, a procedure, a method of manufacturing or fabrication, etc.

Figure 1:
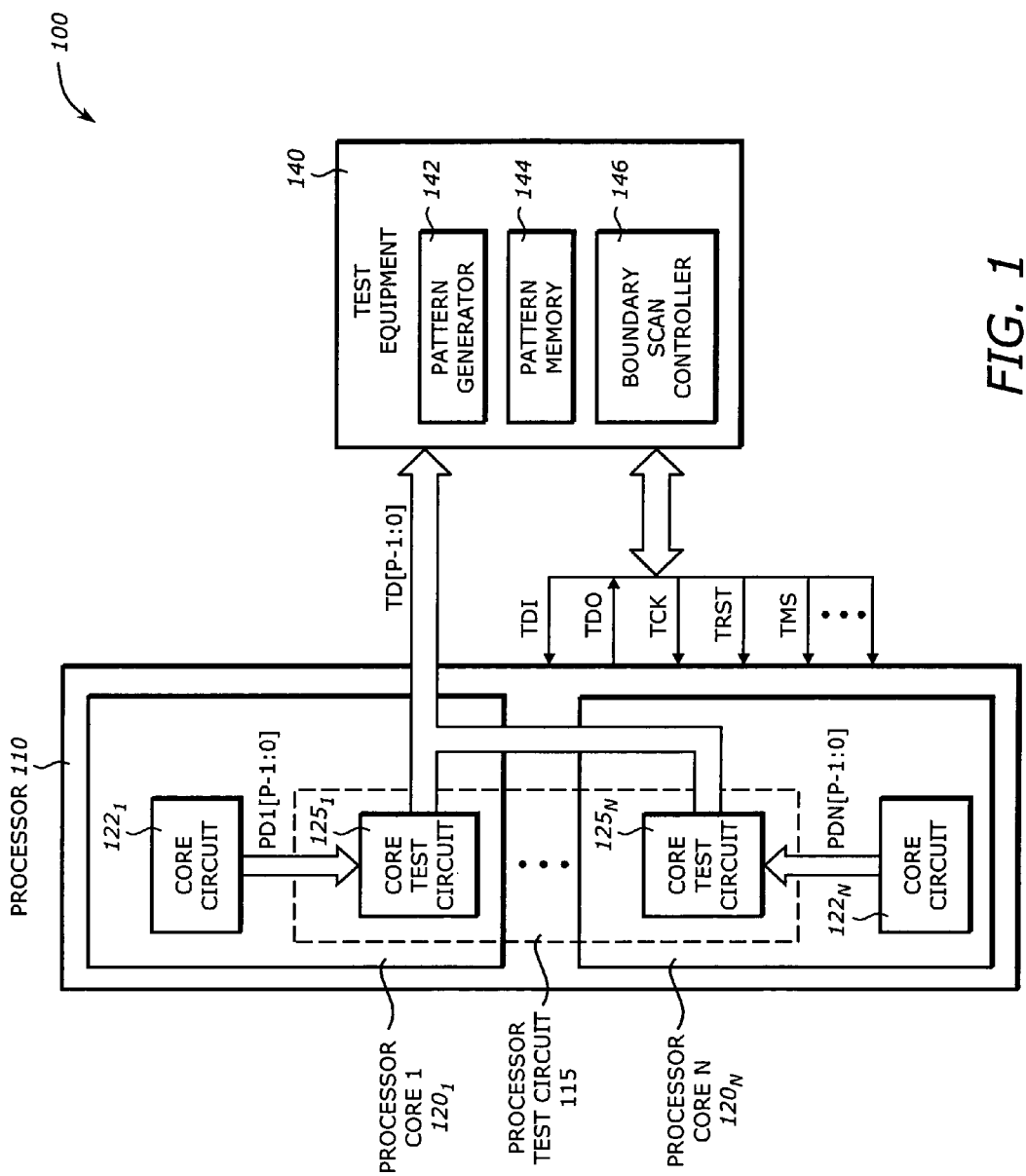
FIG. 1 is a diagram illustrating a system in which one embodiment of the invention can be practiced.

FIG. 1 is a diagram illustrating a system 100 in which one embodiment of the invention can be practiced. The system 100 includes a processor 110, a test interface circuit 130, and a test equipment or device 140.

The processor 110 may represent a central processing unit of any type of architecture, such as processors using hyper threading, security, network, digital media technologies, multi-core processors, embedded processors, mobile processors, micro-controllers, digital signal processors, superscalar computers, vector processors, single instruction multiple data (SIMD) computers, complex instruction set computers (CISC), reduced instruction set computers (RISC), very long instruction word (VLIW), or hybrid architecture. Typically, the processor 110 is a multi-core processor having multiple processor cores. It may include N processor cores $120_1$ to $120_N$ where N is a positive integer. For example, N may be 2, 4, etc. Each of the N processor cores $120_1$ to $120_N$ may include a core circuit $122_i$ and a core test circuit $125_i$, where i=1, . . . , N; e.g., the processor core $120_1$ includes a core circuit $122_1$ and a core test circuit $125_1$, etc. The N core test circuits $125_1$ to $125_N$ may form a processor test circuit 115. The core circuit $122_i$ may generate core data PDi[P-1:0] to the corresponding test circuit $125_i$ where P is a positive integer. The word length P may be any suitable value such as 16, 32, 64, or 128 bits. In one embodiment, the N processor cores are fabricated using a joined-at-bump process or they contain circuits that are non-cooperating or unshared during testing. In a joined-at-bump assembly design, device signals pads are joined, or shorted, together at the package pins.

The test equipment or device 140 may perform various functional and structural tests on the processor 110. In one embodiment, the test equipment 140 and the processor test circuit 115 may be in compliance with the Institute of Electrical and Electronic Engineers (IEEE) 1149.1-2001 standard, entitled Standard Test Access Port and Boundary Scan Architecture. The standard was originally developed by the Joint Test Action Group (JTAG). The interface signals include a Test Reset Input (TRST) signal, a Test Clock (TCK) signal, a Test Mode Select (TMS) signal, a Test Data Input (TDI) signal, and a Test Data Output (TDO) signal. The test equipment or device 140 may include a pattern generator 142, a pattern memory 144, and a boundary scan controller 146. The pattern generator 142 may generate test pattern data or signals. The pattern memory 144 may store test pattern data. The boundary scan controller 146 may include circuitry to generate and process the test interface signals such as the JTAG signals above. The test equipment 140 may receive the test data output TD[P-1:0] from the processor test circuit 115. The word length P may be any suitable value such as 16, 32, 64, or 128 bits.

Embodiments of the invention may be used in a multi-core processor or a sub-system with multiple processors. The use of the processors or systems described herein is for illustrative purposes only. Other circuits having non-cooperative or non-shared circuit components during testing may also be employed.

Figure 2:
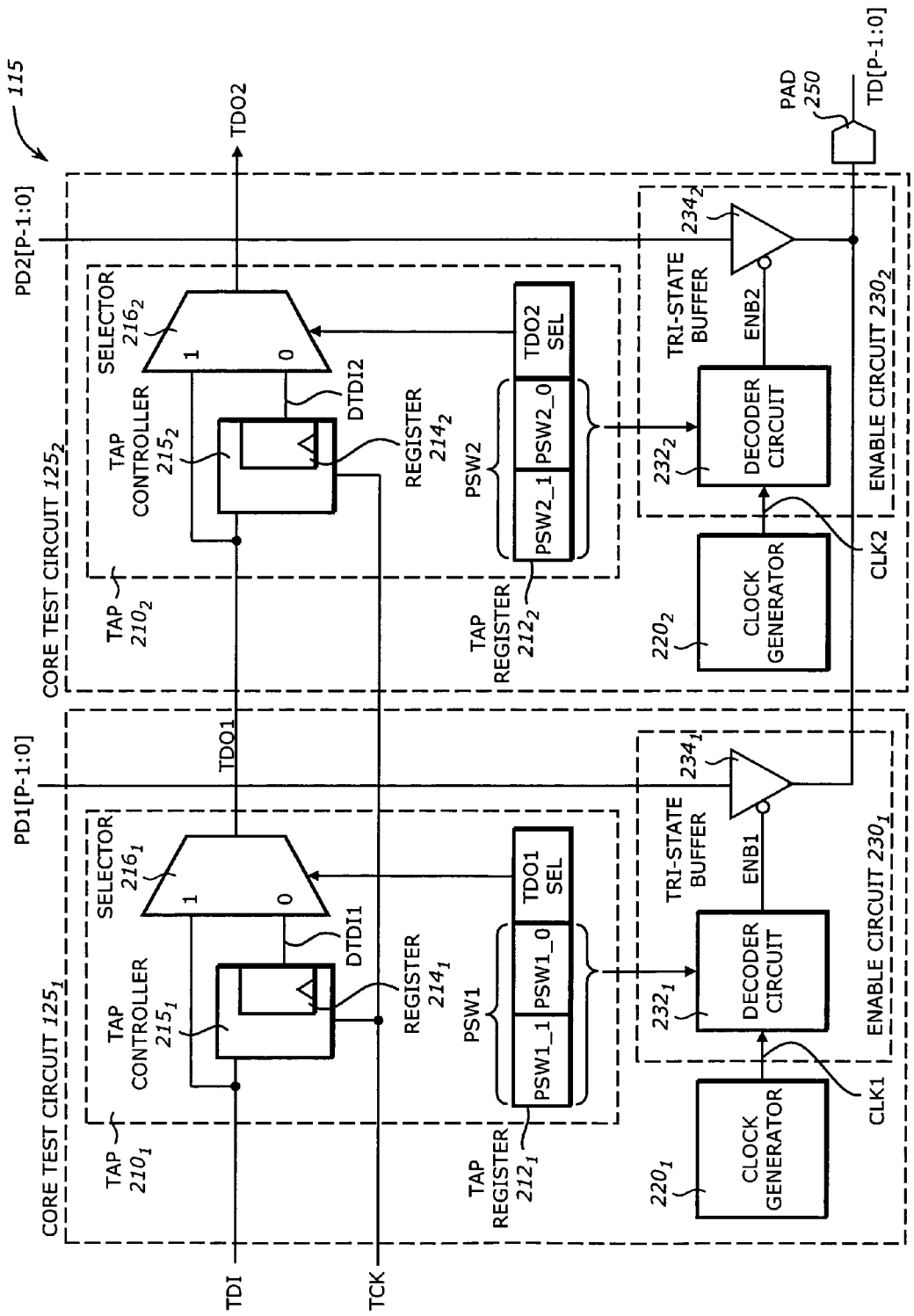
FIG. 2 is a diagram illustrating a processor test circuit according to one embodiment of the invention.

FIG. 2 is a diagram illustrating a processor test circuit 115 according to one embodiment of the invention. The processor test circuit 115 includes the core test circuits $125_1$ to $125_N$. For clarity and illustrative purposes, only two core test circuit $125_1$ and $125_2$ are shown for a dual core processor. The two core test circuits $125_1$ and $125_2$ may be identical with differences in the contents of the configuration or instruction registers or the decoder circuits as will be described later.

The core test circuit $125_1$ may be associated with a processor core 1 $120_1$. It may include a test access port (TAP) $210_1$, a clock generator $220_1$, and an enable circuit $230_1$. The TAP $210_1$ may generate a test data output 1 (TDO1) from a test data input (TDI) or a delayed TDI (DTDI1) according to a TDO1 select bit (TDO1SEL). The delayed TDI may be clocked by the TCK signal. The TAP $210_1$ may also generate a phase select word PSW1. The clock generator $220_1$ may generate a clock signal CLK1 synchronized with the TCK signal. The clock signal CLK1 has a low phase and a high phase. The enable circuit $230_1$ enables the TDO1 in one of the low and high phases of the clock signal according to the phase select word PSW1 from the TAP $210_1$.

The TAP $210_1$ may include a TAP register $212_1$, a TAP controller $215_1$, and a selector $216_1$. The TAP register $212_1$ may store the TDO1 select bit and the phase select word PSW1. The TAP controller $215_1$ may be a normal TAP controller complying with the IEEE 1149.1-2001 standard with an additional register $214_1$. The register $214_1$ may provide the DTDI1 using the TCK. It may be implemented as a flip-flop clocked by the TCK signal. The selector $216_1$ may select the TDI or the DTDI1 using the TDO1SEL select bit. It may be implemented as a two-to-one multiplexer or a data selector. One input of the selector $216_1$ may be connected to the TDI input and the other input may be connected to the delayed TDI input DTDI1. For example, when the TDO1SEL select bit is a logic HIGH, the selector $216_1$ selects the TDI input. When the TDO1SEL select bit is a logic LOW, it selects the delayed TDI input DTDI1.

The clock generator $220_1$ may generate a clock signal synchronized with the TCK signal. It may contain a buffer circuit that buffers the TCK signal. As will be described later, the clock signal may be in-phase with the TCK signal or out-of-phase with, or complementary to, the TCK signal depending on how the enable circuit $230_1$ is designed.

The enable circuit $230_1$ may include a decoder circuit $232_1$ and a tri-state buffer $234_1$. The decoder circuit $232_1$ may decode the phase select word PSW and generate an enable signal ENB1 to the tri-state buffer $234_1$. The tri-state buffer $234_1$ may buffer the PD1[P-1:0] data from the corresponding core circuit $122_1$. It may enable the PD1[P-1:0] data at its tri-state output according to the enable signal ENB1. It is understood that the tri-state buffer $234_1$ may include a number of buffers to accommodate the P-1 bits of the PD1[P-1:0]. The enable signal ENB1 may be connected to all the buffers in the tri-state buffer $234_1$. As is known by one skilled in the art, other circuits or devices may be used instead of the tri-state buffers to select the PD1[P-1:0] such as multiplexers, data selectors. The enable signal ENB1 may be used to select the PD1[P-1:0].

The core test circuit $125_2$ may be associated with a processor core 2 $120_2$. It may include a test access port (TAP) $210_2$, a clock generator $220_2$, and an enable circuit $230_2$. The TAP $210_2$ may generate a test data output 2 (TDO2) from a test data input (TDI) or a delayed TDI (DTDI2) according to a TDO2 select bit (TDO2SEL). The DTDI2 may be clocked by the TCK signal. The TAP $210_2$ may also generate a phase select word PSW2. The clock generator $220_2$ may generate a clock signal CLK2 synchronized with the TCK signal. The clock signal CLK2 may have a low phase and a high phase. The enable circuit $230_2$ may enable the TDO2 in one of the low and high phases of the clock signal according to the phase select word PSW2 from the TAP $210_2$.

The TAP $210_2$ may include a TAP register $212_2$, a TAP controller $215_2$, and a selector $216_2$. The TAP register $212_2$ may store the TDO2SEL select bit and the phase select word PSW2. The TAP controller $215_2$ may be a normal TAP controller complying with the IEEE 1149.1-2001 standard with an additional register $214_2$. The register $214_2$ may provide the DTDI2 using the TCK. It may be implemented as a flip-flop clocked by the TCK signal. The selector $216_2$ may select the TDI or the DTDI2 using the TDO2SEL select bit. It may be implemented as a two-to-one multiplexer or a data selector. One input of the selector $216_2$ may be connected to the TDI input and the other input may be connected to the DTDI2 input. For example, when the TDO2SEL select bit is a logic HIGH, the selector $216_2$ selects the TDI input. When the TDO2SEL select bit is a logic LOW, it selects the delayed TDI input DTDI2.

The clock generator $220_2$ may be similar to the clock generator $220_1$. It may contain a buffer circuit that buffers the TCK signal. As with the clock generator $220_1$, the clock signal may be in-phase with the TCK signal or out-of-phase with, or complementary to, the TCK signal depending on how the enable circuit $230_2$ is designed.

The enable circuit $230_2$ may include a decoder circuit $232_2$ and a tri-state buffer $234_2$. The decoder circuit $232_2$ may decode the phase select word PSW2 and generate an enable signal ENB2 to the tri-state buffer $234_2$. The tri-state buffer $234_2$ may buffer the PD2[P-1:0] data from the corresponding core circuit $122_2$. It may enable the PD2[P-1:0] data at its tri-state output according to the enable signal ENB2. It is understood that the tri-state buffer $234_2$ may include a number of buffers to accommodate the P-1 bits of the PD2[P-1:0]. The enable signal ENB2 may be connected to all the buffers in the tri-state buffer $234_2$. As discussed above, other circuits or devices (e.g., multiplexers, data selectors) may be used to select the PD2[P-1:0] when it is enabled.

The core test circuits $125_1$ and $125_2$ may be identical except that their TAP registers may be programmed or configured with different contents and the decoder circuits $232_1$ and $232_2$ may have different decoding logic. The output of the tri-state buffer $234_2$ in the core test circuit $125_2$ may be connected to the output of tri-state buffer $234_1$ in the core test circuit $125_1$ to form processor test data output TD[P-1:0] to go to a pad 250 available at a pin of the processor 110. The TAP register $212_1$ and the TAP register $212_2$ may be available for programming, configuration, or writing during the testing process. The programming may be done by the test equipment 140. By programming the TAP register $212_1$ and the TAP register $212_2$, the test equipment 140 may set up or configure the core test circuit $125_1$ and core test circuit $125_2$ in various test modes.

Two basic test modes may be available. The first mode is a default, normal, or standard mode where it may be compatible with the standard serial boundary scan technique as provided by the IEEE 1149.1-2001 standard. The individual test circuits in the processor may be connected in a daisy chain manner where the output of one TAP may be connected to the input of the next TAP in the chain. The second mode is the enhanced, or parallel test mode where multiple cores in the processor 110 may be tested in parallel. In the same clock cycle that is synchronized with the clock signal from the test equipment 140, two test data outputs may be available. In the serial, default, or normal mode, the TDO1SEL may be programmed to select the TDI input while the TDO2SEL may be programmed to select the delayed DTDI2 input. In the parallel test mode, the TDO1SEL may be programmed to select the TDI input while the TDO2SEL may be programmed to also select the same TDI input. In addition, in the normal mode, the PSW1 and the PSW2 may be programmed such that one output of the tri-state buffer $234_1$ or $234_2$ may be available in a full clock period of the clock signal. In the parallel mode, the PSW1 and the PSW2 may be programmed such that each output of the tri-state buffer $234_1$ or $234_2$ may be available only half of the clock period of the clock signal. In this way, both processor cores may be tested at the same time in one full clock period to achieve parallel testing. The decoder circuits $232_1$ and $232_2$ may be designed such that in the parallel mode, at most only one of the tri-state buffers $234_1$ and $234_2$ may be enabled at a time to avoid bus contention at the tri-state buffer outputs.

In one embodiment, the decoder circuits $232_1$ and $232_2$ may have different logic expressions. The decoder circuit $232_1$ may decode the PSW1 to gate the clock signal CLK1 as the enable signal to the tri-state buffer $234_1$. The decoder circuit $232_2$ may decode the PSW2 to gate the complement of the clock signal CLK1 as the enable signal to the tri-state buffer $234_1$. Alternatively, in another embodiment, the logic expressions for both decoder circuits may be the same, but the tri-state buffers $234_1$ and $234_2$ may have complementary logic level for the enable signal (e.g., the tri-state buffer $234_1$ may be enabled when the ENB1 is LOW while the tri-state buffer $234_2$ may be enabled when the ENB2 is HIGH). Yet, in another embodiment, the logic expressions of the decoder circuits $232_1$ and $232_2$ and the active levels of the enable signal ENB1 and ENB2 may be the same, but the clock signals CLK1 and CLK2 may be complementary. By gating the CLK1 or CLK2 signal to enable the corresponding tri-state buffer, the PD1[P-1:0] or the PD2[P-1:0] at the tri-state buffer output may be properly enabled at half the clock period in an interleaving manner and synchronized with the TCK signal. In other words, the PD1[P-1:0] and PD2[P-1:0] may be enabled in alternating phases of the clock signal, either the CLK1 or the CLK2 assuming that they are the same.

Figure 3A:
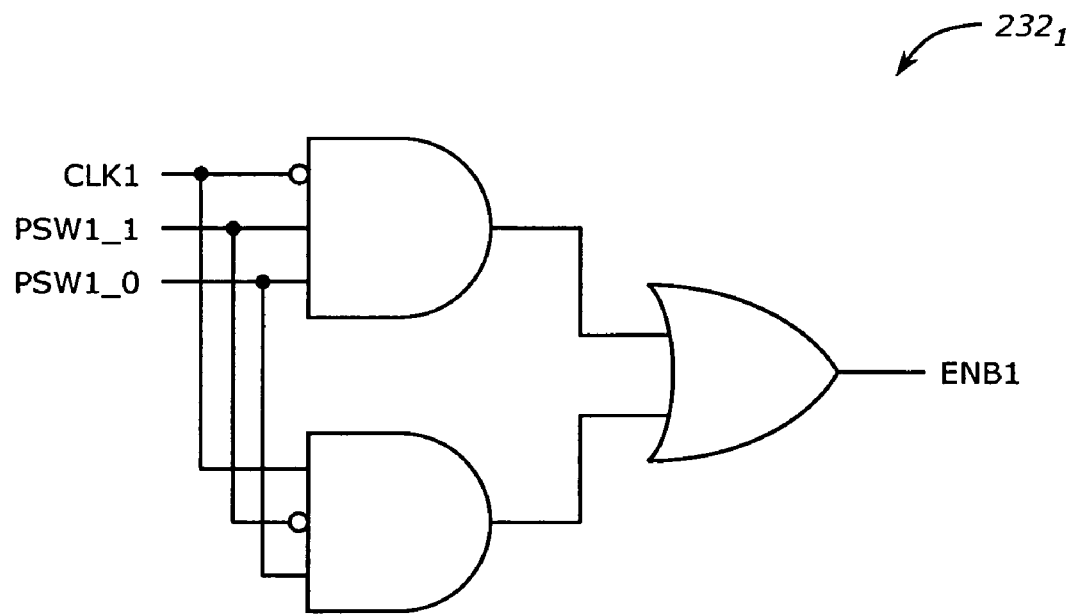
FIG. 3A is a diagram illustrating a decoder circuit of a first core test circuit according to one embodiment of the invention.
Figure 3B:
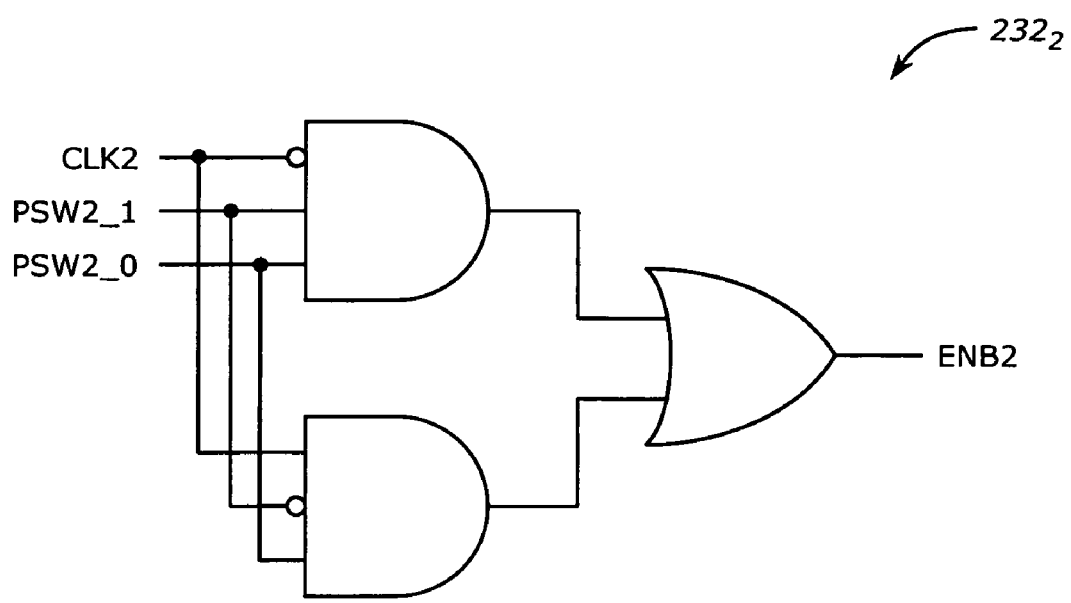
FIG. 3B is a diagram illustrating a decoder circuit of a second core test circuit according to one embodiment of the invention.

Assuming the active level of the enable signals in both enable circuits $230_1$ and $230_2$ are the same (e.g., active LOW) and the CLK1 and CLK2 signals are the same, the logic expressions for the decoder circuits $232_1$ and $232_2$ may be derived as shown in FIGS. 3A and 3B FIG. 3A is a diagram illustrating the decoder circuit $232_1$ in the core test circuit $125_1$ according to one embodiment of the invention. The decoder circuit $232_1$ may have three inputs: the CLK1 signal and two bits of the PSW1 (PSW1_0 and PSW1_1). The PSW1_0 bit may be used to enable the parallel test mode. When it is asserted (e.g., logical HIGH), the ENB1 signal may have alternating phase generation to control the tri-state buffer $234_1$. When it is negated (e.g., logical LOW), the ENB1 signal may have no alternating phases and the tri-state buffer $234_1$ is enabled at all times.

When the PSW1_1 is LOW, the low phase of the CLK1 signal may be gated through to enable the tri-state buffer $234_1$ and the high phase of the CLK1 signal may be gated through to disable the tri-state buffer $234_1$. When the PSW1_1 is HIGH, the high phase of the CLK1 signal may be gated through to enable the tri-state buffer $234_1$ and the low phase of the CLK1 signal may be gated through to disable the tri-state buffer $234_1$. The truth table of the logic expression for the decoder circuit $232_1$ may be shown in Table 1 where a1, b1, and c1 are CLK1, PSW1_1 and PSW1_0, respectively.

TABLE 1

| a1 | b1 | c1 | ENB1 |
|---|---|---|---|
| 0 | 0 | 0 | 0 |
| 0 | 0 | 1 | 0 |
| 0 | 1 | 0 | 0 |
| 0 | 1 | 1 | 1 |
| 1 | 0 | 0 | 0 |
| 1 | 0 | 1 | 1 |
| 1 | 1 | 0 | 0 |
| 1 | 1 | 1 | 0 |

The logic circuit for the decoder $232_1$ includes two AND gates and one OR gate as shown in FIG. 3A. As is known by one skilled in the art, any other circuit implementations in accordance to the desired logic operations as described above may also be possible.

FIG. 3B is a diagram illustrating the decoder circuit $232_2$ in the core test circuit $125_2$ according to one embodiment of the invention. The decoder circuit $232_2$ may have three inputs: the CLK2 signal and two bits of the PSW2 (PSW2_0 and PSW2_1). The PSW2_0 bit may be used to enable the parallel test mode. When it is asserted (e.g., logical HIGH), the ENB1 signal may have alternating phase generation to control the tri-stat buffer $234_2$. When it is negated (e.g., logical LOW), the ENB2 signal may have no alternating phases and the tri-state buffer $234_2$ may be enabled at all times.

When the PSW2_1 is LOW, the high phase of the CLK2 signal may be gated through to disable the tri-state buffer $234_2$ and the low phase of the CLK2 signal may be gated through to enable the tri-state buffer $234_2$. When the PSW2_1 is HIGH, the high phase of the CLK2 signal is gated through to enable the tri-state buffer $234_2$ and the low phase of the CLK2 signal is gated through to disable the tri-state buffer $234_2$. The truth table of the logic expression for the decoder circuit $232_2$ may be shown in Table 2 where a2, b2, and c2, are CLK2, PSW2_1 and PSW2_0, respectively.

TABLE 2

| a2 | b2 | c2 | ENB2 |
|---|---|---|---|
| 0 | 0 | 0 | 0 |
| 0 | 0 | 1 | 0 |
| 0 | 1 | 0 | 0 |
| 0 | 1 | 1 | 1 |
| 1 | 0 | 0 | 0 |
| 1 | 0 | 1 | 1 |
| 1 | 1 | 0 | 0 |
| 1 | 1 | 1 | 0 |

The logic circuit for the decoder $232_2$ may include two AND gates and an OR gate as shown in FIG. 3B. As is known by one skilled in the art, any other circuit implementations in accordance to the desired logic operations as described above may also be possible.

In one embodiment, the contents of the TAP registers $212_1$ and $212_2$ for the decoder circuits $232_1$ and $232_2$ shown in FIGS. 3A and 3B may be as follows. These are values to describe the settings for enabling the parallel test mode.

PSW1_1=1
PSW1_0=1

Figure 4:
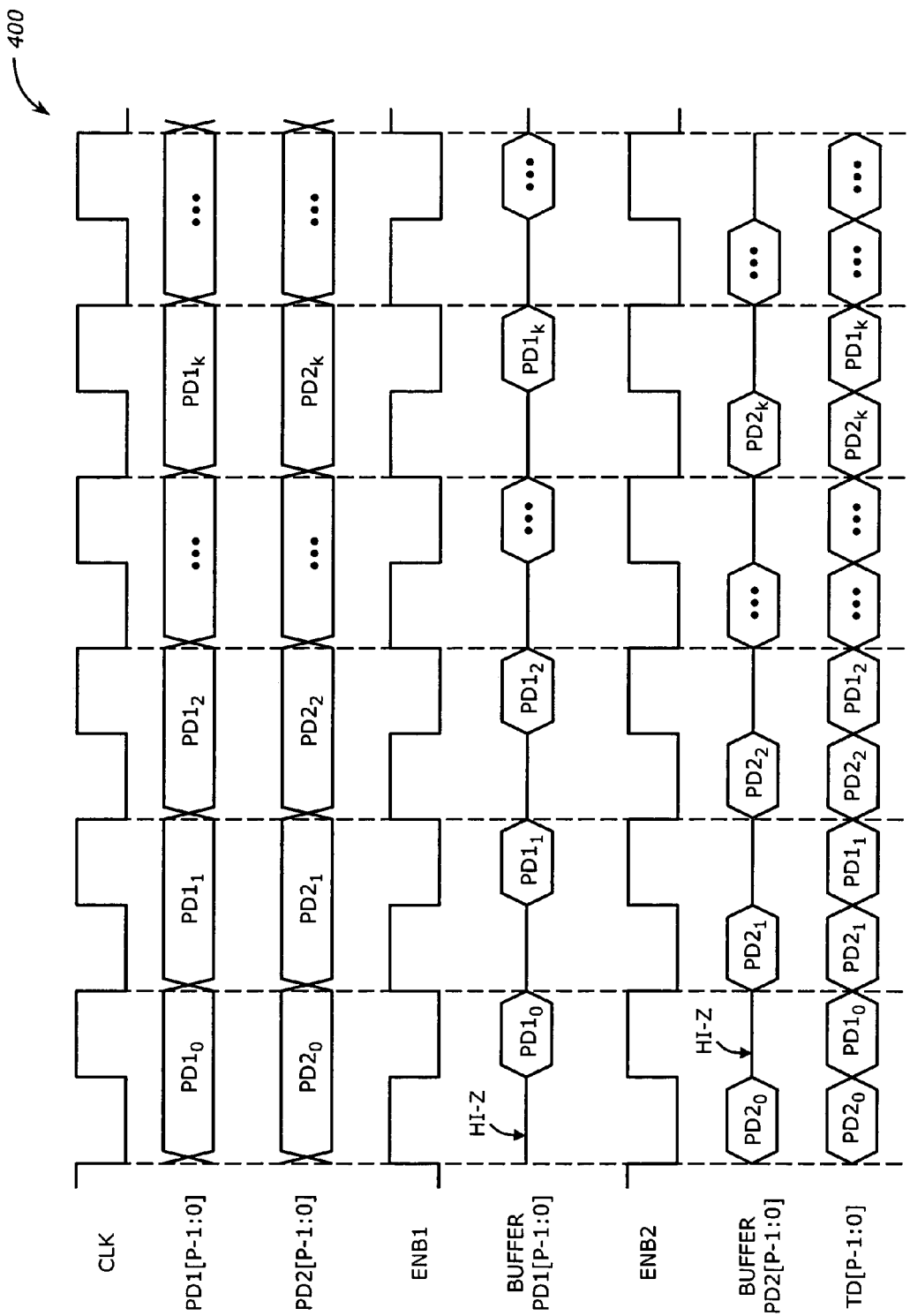
FIG. 4 is a timing diagram illustrating a sequence of processor test data outputs according to one embodiment of the invention.

TDO1SEL=1
PSW2_1=0
PSW2_0=1
TDO2SEL=don't cares
or:
PSW1_1=0
PSW1_0=1
TDO1SEL=1
PSW2_1=1
PSW2_1=1
TDO2SEL=don't cares FIG. 4 is a timing diagram 400 illustrating a sequence of processor test data outputs according to one embodiment of the invention. The timing diagram 400 shows the timing relationships of the PD1[P-1:0], PD2[P-1:0], ENB1, ENB2, buffer PD1[P-1:0], buffer PD1[P-1:0], and TD[P-1:0]. The buffer PD1[P-1:0] and PD2[P-1:0] are the outputs of the respective tri-state buffers $234_1$ and $234_2$ shown in FIG. 2. This timing diagram assumes the decoder circuits shown in FIGS. 3A and 3B are used and the TAP registers $212_1$ and $212_2$ are programmed as above.

The CLK1 and CLK2 signals may be the same in both test circuits and may be represented by the CLK waveform. The PD1[P-1:0] shows the first core data sequence $PD1_1$, $PD1_1$, . . . , $PD1_k$, . . . The PD2[P-1:0] shows the second core data sequence $PD2_0$, $PD2_1$, . . . , $PD2_k$, . . . The ENB1 is essentially the same as the CLK signal. The tri-state buffer $234_1$ is therefore enabled during the low phase of the CLK signal and disabled during the high phase of the CLK signal. The buffer PD1[P-1:0] may contain the wide test data out for the core circuit $122_1$.

The ENB2 may be essentially the complement of the CLK signal. The tri-state buffer $234_2$ is therefore enabled during the high phase of the CLK signal and disabled during the low phase of the CLK signal. The buffer PD2[P-1:0] may contain the wide test data out for the core circuit $122_2$.

The processor TD[P-1:0] at the pad therefore may have both data outputs from the two test circuits in one full clock period. In this manner, both the processor cores may be tested at the same time in the same clock period. The test data may be interleaved within the same clock cycle. The PD1[P-1:0] and PD2[P-1:0] may be enabled in alternating phases of the clock signal. One test data input is received by both cores and two test output data are provided by the processor for a dual core processor. The parallel test mode is therefore highly efficient in structural testing, resulting in significant cost saving for processor testing.

Figure 5:
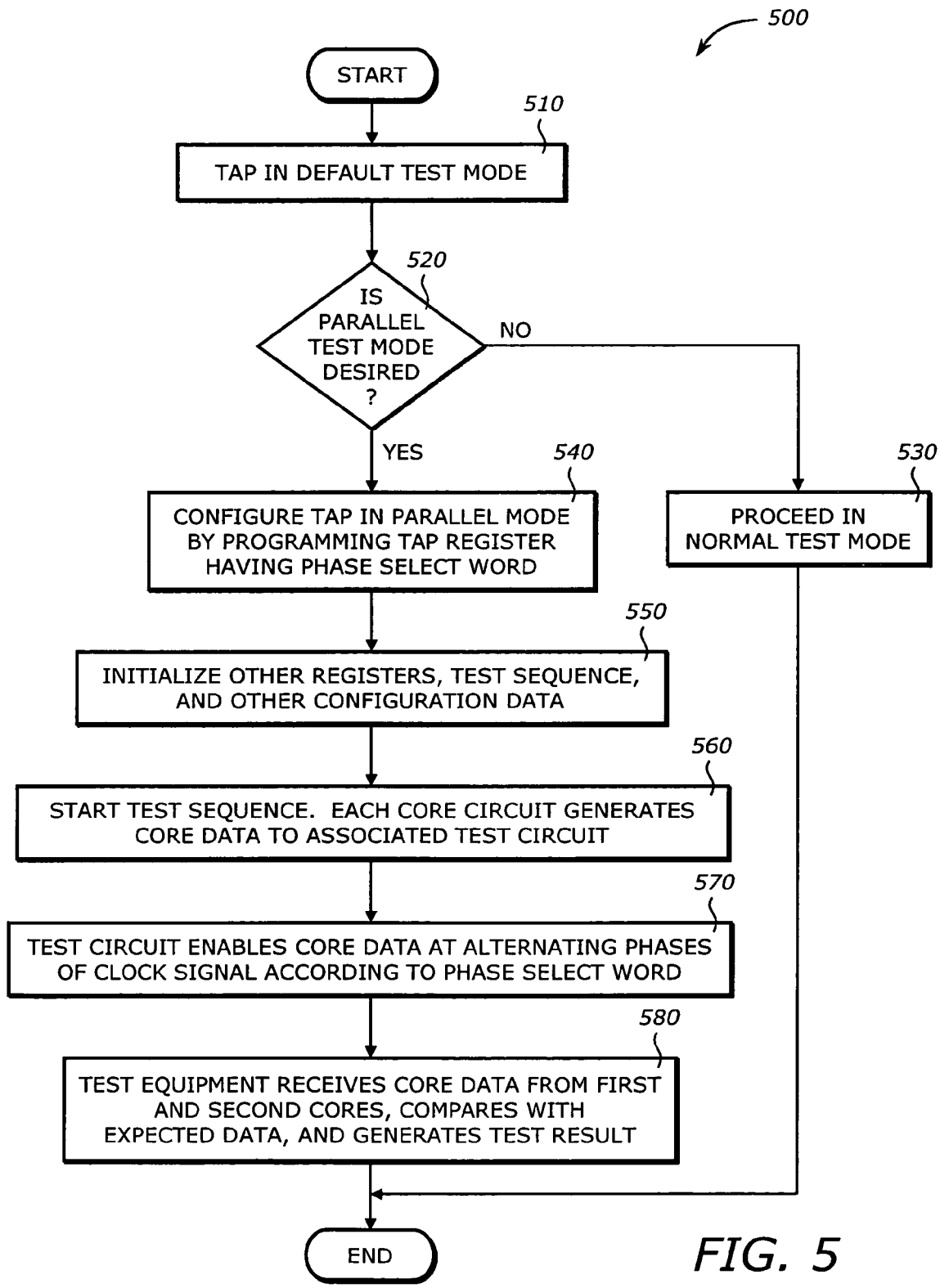
FIG. 5 is a flowchart to illustrate a process to perform a parallel test of a multi-core processor according to one embodiment of the invention.

FIG. 5 is a flowchart to illustrate a process 500 to perform a parallel test of a multi-core processor according to one embodiment of the invention.

Upon START, the TAP in each of the test circuits is in the default or normal mode (Block 510). Then, the process 500 determines if the parallel test mode is desired (Block 520). If not, the process 500 proceeds to the normal test mode (Block 530) and is then terminated. Otherwise, the process 500 configures the TAP in the parallel test mode by programming the TAP register (Block 540). Programming the TAP register includes programming the phase select word and the TDO-iSEL bit. For parallel test mode, all the TAP registers in the core test circuits are programmed or written with appropriate configuration data.

Next, the process 500 initializes other registers, test sequence, and other configuration data as needed (Block 550). Then, the process 500 starts the test sequence (Block 560). During the test sequence, the test data input is shifted into the processor through the core circuits. Each of the core circuits generates the core data in response to the test data input to the associated test circuit.

Then, the test circuit enables the core data at alternating phases of the clock signal according to the programmed phase select word (Block 570). Next, the test equipment receives the core data from the first and second cores (Block 580). These core data form the processor test data. The test equipment compares the received processor test data output with the expected data and generates the test results. The process 500 is then terminated.

The parallel test mode as described above may be extended to a processor having more than two processor cores. For a processor having N cores, N/2 test sequences may be applied repetitively. Each test sequence may be applied for two cores at a time. The hardware for the test circuits for N cores may be the same, resulting in efficient design overhead and use of silicon real estate.

While the invention has been described in terms of several embodiments, those of ordinary skill in the art will recognize that the invention is not limited to the embodiments described, but can be practiced with modification and alteration within the spirit and scope of the appended claims. The description is thus to be regarded as illustrative instead of limiting.

What is claimed is:

1. An apparatus comprising:
   a test access port (TAP) in a first processor core having a first core circuit to generate a first test data output (TDO) from a first test data input (TDI) or a first delayed TDI according to a TDO select bit, the first delayed TDI being clocked by a test clock (TCK), the TAP generating a phase select word;
   a clock generator to generate a clock signal synchronized with the TCK and having a low phase and a high phase; and
   a first enable circuit coupled to the clock generator and the TAP to enable first core data from the first core circuit in one of the low and high phases of the clock signal according to the phase select word.

2. The apparatus of claim 1 wherein the TAP comprises:
   a TAP register to store the TDO select bit and the phase select word;
   a storage element to provide the delayed TDI using the TCK; and
   a selector to select the TDI or the delayed TDI using the TDO select bit.

3. The apparatus of claim 1 wherein the first enable circuit comprises:
   a decoder circuit to decode the phase select word to generate an enable signal; and
   a buffer having a first buffer output coupled to the decoder circuit to enable the first core data at the first buffer output according to the enable signal.

4. The apparatus of claim 3 wherein the first buffer output is connected to a second buffer output of a second enable circuit in a second processor core, at most one of the first and second buffer outputs being enabled at a time, the first and second processor cores having non-cooperative components.

5. The apparatus of claim 1 wherein the first TDI is a second TDO from a second processor core, the first and second processor cores having non-cooperative components.

6. The apparatus of claim 1 wherein the first TDO is a second TDI to a second processor core, the first and second processor cores having non-cooperative components.

7. The system of claim 1 wherein the second processor core has a second core circuit and a second test circuit to interact with the test equipment, the second test circuit comprising:

a second TAP to generate a second TDO from a second TDI or a second delayed TDI according to a second TDO select bit, the second delayed TDI being clocked by the TCK, the second TAP generating a second phase select word, a second clock generator to generate a second clock signal synchronized with the TCK and having a second low phase and a second high phase synchronized with the first low and high phases, respectively, and a second enable circuit coupled to the second clock generator and the second TAP to enable second core data from the second core circuit in one of the second low and high phases of the second clock signal according to the second phase select word.

8. The system of claim 7 wherein the second TAP comprises:

a second TAP register to store the second TDO select bit and the second phase select word;

a second storage element to provide the second delayed TDI using the TCK; and a second selector to select the second TDI or the second delayed TDI using the second TDO select bit.

9. The system of claim 7 wherein the second enable circuit comprises:

a second decoder circuit to decode the second phase select word to generate a second enable signal; and a second buffer having a second buffer output coupled to the second decoder circuit to enable the second core data at the second buffer output according to the second enable signal, the second buffer output being connected to the first buffer output to provide test data output to the test equipment.

10. The system of claim 9 wherein the first and second phase select words are programmed such that the first and second core data are enabled in alternating phases of the first or second clock signal.

11. A method comprising:

configuring a first test access port (TAP) in a first test circuit associated with a first core circuit in a multi-core processor to operate in one of a normal test mode and a parallel test mode, the first TAP having a first clock signal;

generating first core data from the first core circuit; and enabling the first core data in one of first low and high phases of the first clock signal when the first TAP is configured in the parallel test mode.

12. The method of claim 11 wherein configuring comprises:

storing a first phase select word in a first TAP register.

13. The method of claim 12 wherein enabling the first core data comprises:

decoding the first phase select word to generate a first enable signal; and enabling the first core data by a first buffer having a first buffer output at the first buffer output according to the first enable signal.

14. The method of claim 11 further comprising:

configuring a second test access port (TAP) in a second test circuit associated with a second core circuit in the multi-core processor to operate in one of the normal test mode and the parallel test mode, the second TAP having a second clock signal synchronized with the first clock signal;

generating second core data from the second core circuit simultaneously with the first core data; and enabling the second core data in one of second low and high phases of the second clock signal when the second TAP is configured in the parallel test mode.

15. The method of claim 14 wherein configuring the second TAP comprises:

storing a second phase select word in a second TAP register.

16. The method of claim 15 wherein enabling the second core data comprises:

decoding the second phase select word to generate a second enable signal; and enabling the second core data by a second buffer having a second buffer output at the second buffer output according to the second enable signal, the second buffer output being connected to the first buffer output, such that the first and second core data are enabled in alternating phases of the first or second clock signal.

17. A system comprising:

a test equipment; and a processor coupled to the test equipment having at least first and second processor cores, the first processor core having a first core circuit and a first test circuit to interact with the test equipment, the first test circuit comprising:

a first test access port (TAP) to generate a first test data output (TDO) from a first test data input (TDJ) or a first delayed TDJ according to a first TDO select bit, the first delayed TDJ being clocked by a test clock (TCK), the first TAP generating a first phase select word, a first clock generator to generate a first clock signal synchronized with the TCK and having a first low phase and a first high phase, and a first enable circuit coupled to the first clock generator and the first TAP to enable first core data from the first core circuit in one of the first low and high phases of the first clock signal according to the first phase select word.

18. The system of claim 17 wherein the first TAP comprises:

a first TAP register to store the first TDO select bit and the first phase select word;

a first storage element to provide the first delayed TDJ using the TCK; and a first selector to select the first TDI or the first delayed TDI using the first TDO select bit.

19. The system of claim 17 wherein the first enable circuit comprises:

a first decoder circuit to decode the first phase select word to generate a first enable signal; and a first buffer having a first buffer output coupled to the first decoder circuit to enable the first core data at the first buffer output according to the first enable signal.

20. The system of claim 19 wherein the first buffer output is connected to a second buffer output of a second enable circuit in the second processor core, at most one of the first and second buffer outputs being enabled at a time, the first and second processor cores having non-cooperative components.

* * * * *

UNITED STATES PATENT AND TRADEMARK OFFICE
CERTIFICATE OF CORRECTION

PATENT NO. : 7,475,309 B2
APPLICATION NO. : 11/174198
DATED : January 6, 2009
INVENTOR(S) : Picano et al.

It is certified that error appears in the above-identified patent and that said Letters Patent is hereby corrected as shown below:

In column 10, at line 28 delete, "(TDJ)" and insert -- (TDI) --.

In column 10, at line 29 delete, "TDJ" and insert -- TDI --.

In column 10, at line 30 delete, "TDJ" and insert -- TDI --.

In column 10, at line 45 delete, "TDJ" and insert -- TDI --.

Signed and Sealed this

Third Day of August, 2010

David J. Kappos
*Director of the United States Patent and Trademark Office*